United States Patent
Takata et al.

(10) Patent No.: US 12,222,166 B2
(45) Date of Patent: Feb. 11, 2025

(54) HEAT-TRANSFER MEMBER AND COOLING SYSTEM

(71) Applicants: KYUSHU UNIVERSITY, NATIONAL UNIVERSITY CORPORATION, Fukuoka (JP); UACJ Corporation, Tokyo (JP)

(72) Inventors: Yasuyuki Takata, Fukuoka (JP); Koji Takahashi, Fukuoka (JP); Biao Shen, Fukuoka (JP); Junji Nunomura, Hokkaido (JP); Yoichiro Bekki, Aichi (JP); Akihiro Fukatsu, Aichi (JP)

(73) Assignees: Kyushu University, National University Corporation, Fukuoka (JP); UACJ Corporation, Tokyo (JP)

( * ) Notice: Subject to any disclaimer, the term of this patent is extended or adjusted under 35 U.S.C. 154(b) by 691 days.

(21) Appl. No.: 17/600,752

(22) PCT Filed: Apr. 30, 2020

(86) PCT No.: PCT/JP2020/018220
§ 371 (c)(1),
(2) Date: Oct. 1, 2021

(87) PCT Pub. No.: WO2020/226115
PCT Pub. Date: Nov. 12, 2020

(65) Prior Publication Data
US 2022/0196340 A1    Jun. 23, 2022

(30) Foreign Application Priority Data
May 9, 2019    (JP) .................. 2019-089090

(51) Int. Cl.
*F28D 15/04*    (2006.01)
*C09K 5/04*    (2006.01)
(Continued)

(52) U.S. Cl.
CPC ............ *F28D 15/046* (2013.01); *C09K 5/048* (2013.01); *H01L 23/427* (2013.01); *H05K 7/20336* (2013.01); *F28F 2260/00* (2013.01)

(58) Field of Classification Search
CPC ..... F28D 15/046; C09K 5/048; H01L 23/427; H05K 7/20336; F28F 2260/00
(Continued)

(56) References Cited

U.S. PATENT DOCUMENTS

| 10,209,017 B2* | 2/2019 | Hu ..................... B82Y 30/00 |
| 11,118,844 B2* | 9/2021 | Shin ................ F28D 15/0233 |
| 2011/0198059 A1 | 8/2011 | Gavillet et al. .......... B05D 1/36 |

FOREIGN PATENT DOCUMENTS

| CN | 203523220 U | 4/2014 | ............. H02K 7/20 |
| CN | 108167790 A | 6/2018 | ............. F21V 29/51 |

(Continued)

OTHER PUBLICATIONS

Office Action and Search Report from the Chinese Patent Office dispatched Sep. 22, 2023 in related application No. CN202080022606.9, and translation thereof.
(Continued)

*Primary Examiner* — Joel M Attey
(74) *Attorney, Agent, or Firm* — J-TEK LAW PLLC; Jeffrey D. Tekanic; Scott T. Wakeman

(57) ABSTRACT

A heat-transfer member (1) is used in a cooling system in which an alcohol serves as a coolant. The heat-transfer member (1) has: a heat-receiving surface (11) configured such that it can receive heat from a heat-generating body; and a heat-dissipating surface (12) configured such that it can dissipate, to the coolant, the heat received at the heat-receiving surface (11). The heat-dissipating surface (12) has a plurality of pores (121) whose average pore diameter is 5 nm or more and 1,000 nm or less. A cooling system can be
(Continued)

configured by causing the coolant to contact the heat-dissipating surface (12) of the heat-transfer member (1).

20 Claims, 5 Drawing Sheets

(51) Int. Cl.
  *H01L 23/427* (2006.01)
  *H05K 7/20* (2006.01)
(58) Field of Classification Search
  USPC .................................................... 165/104.19
  See application file for complete search history.

(56) References Cited

FOREIGN PATENT DOCUMENTS

| JP | 2004044916 A | 2/2004 | ............. F28D 15/02 |
|----|--------------|--------|--------------------------|
| JP | 2008039378 A | 2/2008 | ............. F28D 15/02 |
| JP | 2010016277 A | 1/2010 | |
| JP | 2011530195 A | 12/2011 | |
| JP | 2015059683 A | 3/2015 | ............. F28D 15/02 |
| JP | 2016040505 A | 3/2016 | ............. F28D 15/02 |
| JP | 2017058103 A | 3/2017 | ............. F28F 13/02 |

OTHER PUBLICATIONS

Office Action from the Japanese Patent Office dispatched May 14, 2024, in related JP application No. 2021-518374, and machine translation thereof.
English translation of the Written Opinion of the International Searching Authority in parent application No. PCT/JP2020/018220.
English translation the International Search Report dispatched Nov. 12, 2020 for parent application No. PCT/JP2020/018220.
Office Action and Search Report from the Chinese Patent Office dated Jan. 27, 2024 in related CN Application No. 202080022606.9, and machine translation thereof.
Office Action from the Chinese Patent Office dispatched Apr. 2, 2024, in related CN application No. 202080022606.9, and machine translation thereof.
Office Action from the Japanese Patent Office dispatched Aug. 6, 2024, in counterpart JP application No. 2021-518374, and machine translation thereof.

* cited by examiner

HEAT-TRANSFER MEMBER AND COOLING SYSTEM

CROSS-REFERENCE

This application is the US national stage of International Patent Application No. PCT/JP2020/018220 filed on Apr. 30, 2020, which claims priority to Japanese Patent Application No. 2019-089090 filed on May 9, 2019.

TECHNICAL FIELD

The present invention relates to a heat-transfer member and to a cooling system.

BACKGROUND ART

A cooling system that utilizes the phase change of a coolant of a boiling-cooling equipment or the like is sometimes incorporated in equipment that generates a large amount of heat, such as an air conditioner, a chiller, a boiler, a heat-engine generator, and the like. In recent years, these types of cooling systems have also sometimes been used in the cooling of semiconductor components having a high heat-generating density, electronic equipment used in data centers, and the like. To improve the cooling performance of a cooling system, it is preferable that the cooling system is operated in a temperature range in which the coolant, which comes into contact with a heat-dissipating surface thereof, is caused to boil.

To protect semiconductor components, electronic equipment, and the like from heat, there is a demand to maintain the temperature of the semiconductor component and the like at a low temperature during operation. Consequently, fluorocarbons, which have a boiling point lower than that of water, are often used as the coolant in cooling systems of semiconductor components and the like in which boiling-heat transfer is utilized. However, because fluorocarbons have a high global warming potential, from the viewpoint of reducing environmental load, there is demand for a coolant to replace fluorocarbons.

To solve such problems, a technique has been proposed (e.g., Patent Document 1), in which a liquid having a small environmental load and a low boiling point, like, for example, ethanol, is used as the coolant.

PRIOR ART LITERATURE

Patent Literature

Patent Document 1
  Japanese Laid-open Patent Publication 2010-16277

SUMMARY OF THE INVENTION

However, because the boiling point of alcohols, such as ethanol, is somewhat higher than fluorocarbons, there is demand to further improve boiling-cooling systems that utilize an alcohol as the coolant compared with boiling-cooling systems that utilize a fluorocarbon as in the past.

It is therefore one non-limiting object of the present teachings to disclose techniques for improving a heat-transfer member and a cooling system that uses a coolant having a low environmental load to increase cooling performance.

In one non-limiting aspect of the present teachings, a heat-transfer member may be configured such that a cooling system, in which an alcohol serves as a coolant, can be used, wherein:
  the heat-transfer member has:
    a heat-receiving surface configured such that it can receive heat from a heat-generating body; and
    a heat-dissipating surface configured such that it can dissipate, to the coolant, the heat received at the heat-receiving surface; and
  the heat-dissipating surface has a plurality of pores whose average hole diameter is 5 nm or more and 1,000 nm or less.

In another non-limiting aspect of the present teachings, the cooling system comprises the heat-transfer member and the coolant according to the above-mentioned aspect.

The above-mentioned heat-transfer member has the plurality of pores, whose average hole diameter is 5 nm or more and 1,000 nm or less, in the heat-dissipating surface, which exchanges heat with the coolant. Thus, by providing the pores in the heat-dissipating surface, the surface area within which the heat-transfer member and the coolant make contact can be enlarged.

In particular, the average pore diameter of the pores provided on the heat-dissipating surface is in an optimal range with respect to the above-mentioned specific coolant. Consequently, the above-mentioned heat-transfer member can form numerous bubbles inside the pores when the coolant is placed in a superheated state, and furthermore can cause the bubbles that have grown inside the pores to depart from the pores at an early stage. For this reason, the above-mentioned heat-transfer member can cause numerous small bubbles to be generated from the pores as soon as the coolant boils. As a result, the coefficient of heat transfer of the heat-dissipating surface can be increased and, in turn, cooling performance can be improved.

As described above, according to the above-mentioned heat-transfer member, a heat-transfer member and a cooling system can be provided that uses a coolant having a low environmental load and that can increase cooling efficiency.

DETAILED DESCRIPTION

Figure 1:
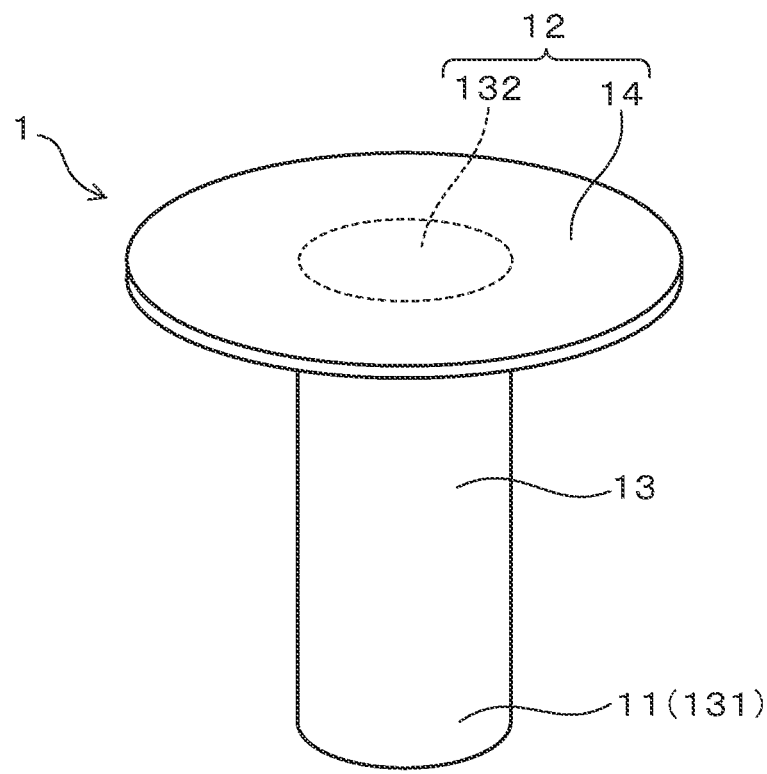
FIG. 1 is an oblique view of a heat-transfer member according to Working Example 1.

The above-mentioned heat-transfer member can be configured as, for example, a pipe, a heat sink, or the like used in a heat pipe. The material of the heat-transfer member is not particularly limited but, from the viewpoint of further improving cooling performance, is preferably composed of a substance having high thermal conductivity, such as copper, a copper alloy, aluminum, an aluminum alloy, or the like.

The heat-transfer member has: a heat-receiving surface, which is configured such that it can receive heat from a heat-generating body; and a heat-dissipating surface, which is configured such that it makes contact with a coolant and can dissipate, to the coolant, the heat received at the heat-receiving surface. In addition, a plurality of pores, having an average pore diameter in the above-mentioned specific range, is provided on the heat-dissipating surface. The pores may be provided on the entire surface of the heat-dissipating surface or may be provided only on (a) partial region(s) thereof. From the viewpoint of improving the cooling performance of the heat-transfer member, the heat-dissipating surface preferably is disposed on a rear surface of the heat-receiving surface.

The average pore diameter of the pores is 5 nm or more and 1,000 nm or less. By setting the average pore diameter of the pores to the above-mentioned specific range, bubbles can be formed easily inside the pores while the above-mentioned specific coolant is boiling. Furthermore, by setting the average pore diameter of the pores to the above-mentioned specific range, excessive growth of the bubbles generated inside the pores can be curtailed, and the bubbles can be caused to depart from the pores at a stage when the size of the bubbles is comparatively small.

Then, by causing the bubbles formed inside the pores to depart at an early stage, the coolant can be supplied into the pores and the next bubbles can be formed. As a result, numerous small bubbles can be generated from the pores, and thereby the coefficient of heat transfer during boiling can be improved and, in turn, the cooling performance can be improved.

From the viewpoint of further enhancing such functions and effects, the average pore diameter of the pores is preferably 10 nm or more and 1,000 nm or less, more preferably 10 nm or more and 700 nm or less, yet more preferably 10 nm or more and 500 nm or less, and in particular preferably 10 nm or more and 200 nm or less.

The average pore diameter of the pores can be calculated by the following method. First, the heat-dissipating surface is observed using a scanning electron microscope (i.e., an SEM), and an SEM image of the pores is acquired. The magnification of the SEM is not particularly limited but is preferably set such that a plurality of the pores is included within the field of view. Next, the circle-equivalent diameter of each pore present in the obtained SEM image is calculated. Furthermore, the arithmetic-average value of these circle-equivalent diameters should be taken as the average hole diameter of the pores. The number of pores used to calculate the average hole diameter of the pores is not particularly limited but should be, for example, ten or more.

Methods of forming the pores are not particularly limited. For example, the pores can be formed using a technique such as, for example, photolithography, ion etching, nanoimprinting, and the like. In addition, for example, in the situation in which the heat-transfer member is composed of aluminum or an aluminum alloy, the pores can be formed easily on the surface of the heat-transfer member by performing an anodization process.

The average depth of the pores is preferably 0.05 μm or more and 10 μm or less. By setting the average depth of the pores to 0.05 μm or more, the effect of promoting the formation of bubbles owing to the pores can be further enhanced. In addition, by setting the average depth of the pores to 10 μm or less, after the bubbles have departed, the coolant can be more rapidly supplied into the pores. As a result, by setting the depth of the pores to the above-mentioned specific range, cooling performance can be further improved. From the viewpoint of further enhancing the functions and effects described above, the average depth of the pores is preferably 0.1 μm or more and 10 μm or less.

The average depth of the pores can be calculated by the following method. First, a cross section perpendicular to the heat-dissipating surface of the heat-transfer member is exposed. Methods of exposing the cross section are not particularly limited. For example, the above-mentioned cross section can be exposed by bending the heat-transfer member into a V shape to cause cracks.

A cross section thereof is observed, using the SEM, from a diagonal direction, and an SEM image is acquired. The magnification of the SEM is not particularly limited but is preferably set such that a plurality of the pores is included within the field of view. Next, the depth of each pore, that is, the distance from the heat-dissipating surface to the bottom of the pore, present in the obtained SEM image is calculated. Furthermore, the arithmetic-average value of the distances of these pores should be taken as the average depth of the pores. The number of pores used to calculate the average depth of the pores is not particularly limited but should be, for example, three or more.

The above-mentioned heat-dissipating surface preferably has a coolant-philic part whose contact angle with respect to ethanol is 40° or less. In this situation, because an alcohol, which is serving as the coolant, more easily makes contact with the coolant-philic part, the coolant can be heated more efficiently at the coolant-philic part. As a result, the generation of bubbles can be further promoted, and thereby cooling performance can be improved.

Various configurations of the arrangement of the coolant-philic part on the heat-dissipating surface are possible. For example, the entire surface of the heat-dissipating surface may be the coolant-philic part, or a portion of the heat-dissipating surface may be the coolant-philic part. The number of the coolant-philic parts of the heat-dissipating surface may be one location or may be two or more locations. The coolant-philic part(s) may be disposed at (a) portion(s) of the heat-dissipating surface having pores or may be disposed at (a) portion(s) not having pores. From the viewpoint of reliably achieving the result of promoting the generation of bubbles, the coolant-philic part(s) preferably is (are) disposed at (a) portion(s) of the heat-dissipating surface that has (have) pores.

The above-mentioned heat-dissipating surface preferably further has (a) coolant-phobic part(s) that is (are) disposed adjacent to the above-mentioned coolant-philic part(s) and whose contact angle with respect to ethanol is larger than that of the coolant-philic part(s). In the situation in which the alcohol serving as the coolant is boiling, portion(s) that make(s) contact with the alcohol in the liquid phase and portion(s) that make(s) contact with the bubbles, that is, portion(s) that make(s) contact with alcohol vapor, are present on the heat-dissipating surface. Because alcohols have a hydroxyl group, the wettability of the alcohol in the liquid phase with respect to the coolant-philic part(s) is higher than with respect to the coolant-phobic part(s).

For that reason, by providing the coolant-philic part(s) on the heat-dissipating surface, the alcohol in the liquid phase easily comes into contact with the coolant-philic part(s), as described above, and thereby the effect of promoting the generation of bubbles at the coolant-philic part(s) can be expected.

On the other hand, with regard to the coolant-phobic part(s), because the wettability of alcohol in the liquid phase is low compared with the coolant-philic part(s), the bubbles generated at the coolant-philic part(s) tend to be guided to the coolant-phobic part(s). For that reason, by providing both the coolant-philic part(s) and the coolant-phobic part(s) on the heat-dissipating surface, it is conceivable that bubbles can be generated principally at the coolant-philic part(s) and bubbles can be caused to depart principally at the coolant-phobic part(s). As a result, the effect—in which the temperature of boiling incipience is lowered and, owing to a low degree of superheating, the heat-transfer efficiency transitions to a high boiling-heat transfer—can be expected.

Furthermore, when the bubbles depart from the coolant-phobic part(s), a flow of the liquid phase coolant can be formed on the coolant-phobic part(s) attendant with the rising of the bubbles. As a result, it can be expected that convection of the coolant in the liquid phase will be promoted and that the coolant in the liquid phase can be supplied with good efficiency to the heat-dissipating surface.

Thus, by providing the coolant-philic part(s) and the coolant-phobic part(s) on the heat-dissipating surface, the effect of forming and departing the bubbles more efficiently and the effect of promoting the convection of the coolant can be expected. As a result, it is conceivable that the boiling of the coolant can be caused to start at a lower degree of superheating and thereby cooling performance can be further improved.

From the viewpoint of further enhancing the effect of improving cooling performance described above, the contact angle of the coolant-phobic part(s) with respect to ethanol is preferably 90° or more.

Various configurations of the arrangement of the coolant-phobic part(s) of the above-mentioned heat-dissipating surface are possible. For example, the number of the coolant-phobic part(s) of the heat-dissipating surface may be at one location or may be at two or more locations. The coolant-phobic part(s) may be disposed at (a) portion(s) of the heat-dissipating surface having pores or may be disposed at (a) portion(s) not having pores. From the viewpoint of reliably achieving the functions and effects described above, the heat-dissipating surface preferably has a plurality of the coolant-phobic parts. In addition, the heat-dissipating surface preferably has the above-mentioned coolant-phobic parts at two or more locations per 1 cm². Furthermore, the surface area of each of the above-mentioned coolant-phobic parts is preferably 0.1 mm² or more and more preferably 0.5 mm² or more.

A cooling system can be configured by causing the coolant to contact the above-mentioned heat-dissipating surface of the above-mentioned heat-transfer member. More specifically, in the situation in which, for example, the above-mentioned heat-transfer member is a pipe, a heat pipe can be configured as a cooling system by making the outer surface of the heat-transfer member the heat-receiving surface, making the inner surface the heat-dissipating surface, and sealing the coolant or the like in the pipe of the heat-transfer member. In addition, in the situation in which, for example, the heat-transfer member is a heat sink, by installing a heat-generating body of a semiconductor device or the like on the above-mentioned heat-receiving surface, disposing the above-mentioned heat-dissipating surface along a coolant passageway, and causing the coolant to flow, it is possible to configure a cooling system that comprises the coolant passageway, the coolant, which flows through the interior of the coolant passageway, and the heat-transfer member, which makes contact with the coolant at the heat-dissipating surface.

An alcohol, such as ethanol, propanol, isopropanol, or the like, can be used as the coolant. Among these alcohols, it is preferable to use as the coolant an alcohol whose boiling point is lower than 100° C. and in particular it is preferable to use ethanol. In this situation, the coolant boils at a stage prior to when the temperature of the semiconductor device, electronic equipment, or the like rises excessively and causes a malfunction, and thereby a further rise in the temperature of the semiconductor device, the electronic equipment, or the like can be curtailed. For that reason, by using ethanol as the coolant, a cooling system suited to the cooling of a semiconductor device, electronic equipment, or the like can be obtained.

The cooling system is preferably configured such that, when the above-mentioned coolant begins to boil, the degree of superheating of the above-mentioned coolant on the above-mentioned heat-dissipating surface becomes 20 K or lower. In this situation, by causing the coolant on the heat-dissipating surface to boil at an earlier stage, cooling can be performed with good efficiency prior to the temperature of the heat-generating body rising excessively.

In particular, in a cooling system that utilizes boiling-heat transfer, from the standpoint of protecting an electronic device such as a semiconductor, by using the heat-transfer member in which the coolant-philic part(s) and the coolant-phobic part(s) are provided on the heat-dissipating surface, it is conceivable that the degree of superheating of the coolant on the heat-dissipating surface when the above-mentioned coolant begins to boil can be set to 20 K or lower. Thereby, a clear effect is obtained wherein a coolant whose boiling point is lower than water is used.

WORKING EXAMPLES

Working Example 1

Figure 2:
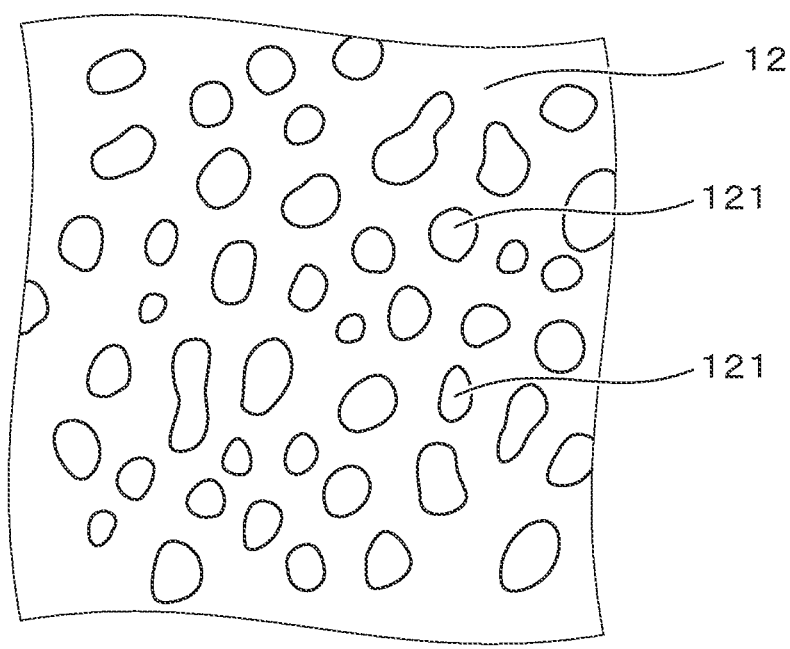
FIG. 2 is a schematic drawing of a heat-dissipating surface of the heat-transfer member according to Working Example 1.

A working example of the above-mentioned heat-transfer member will be explained, with reference to FIG. 1 to FIG. 4. As shown in FIG. 1, a heat-transfer member 1 of the present example has: a heat-receiving surface 11, which is configured such that it can receive heat from a heat-generating body; and a heat-dissipating surface 12, which is configured such that it can dissipate the heat received at the heat-receiving surface 11. As shown in FIG. 2, the heat-dissipating surface 12 has a plurality of pores 121, whose average hole diameter is 5 nm or more and 1,000 nm or less.

More specifically, as shown in FIG. 1, the heat-transfer member 1 of the present example has a rod part 13, which exhibits a circular-columnar shape, and a fin part 14, which extends outward in the radial direction from one end of the rod part 13. The heat-receiving surface 11 is disposed on an end part 131, which is on the side of the rod part 13 that does not have the fin part 14. In addition, the heat-dissipating surface 12 is constituted from: the end surface of the heat-transfer member 1 on the side that has the fin part 14, that is, an end surface 132, which is another end surface of the rod part 13; and the fin part 14, which is disposed around the end surface 132. The heat-transfer member 1 is composed of an aluminum alloy. The diameter of the rod part 13 is 30 mm, and the diameter of the fin part 14 is 50 mm.

The heat-transfer member 1 of the present example can be manufactured by, for example, the following method. First, a column made of an aluminum alloy is prepared, and the rod part 13 and the fin part 14 are formed by a cutting process. Next, it is coated with a protective material, except the heat-dissipating surface 12. By performing an anodization process on the heat-transfer member 1 in this state, an alumite coating having the numerous pores 121 is formed on the heat-dissipating surface 12. The heat-transfer member 1 can be obtained by the above.

The anodization process of the present example is, specifically, a phosphoric acid direct-current alumite process. The average pore diameter of the pores 121 on the heat-dissipating surface 12 of the heat-transfer member 1 is 200 nm. In addition, the average depth of the pores 121 on the heat-dissipating surface 12 of the heat-transfer member 1 is 10 μm. It is noted that the methods of calculating the average pore diameter and the average depth of the pores 121 are as described above.

The cooling performance of the heat-transfer member 1 can be evaluated based on the coefficient of heat transfer in a subcooled pool boiling test.

Figure 3:
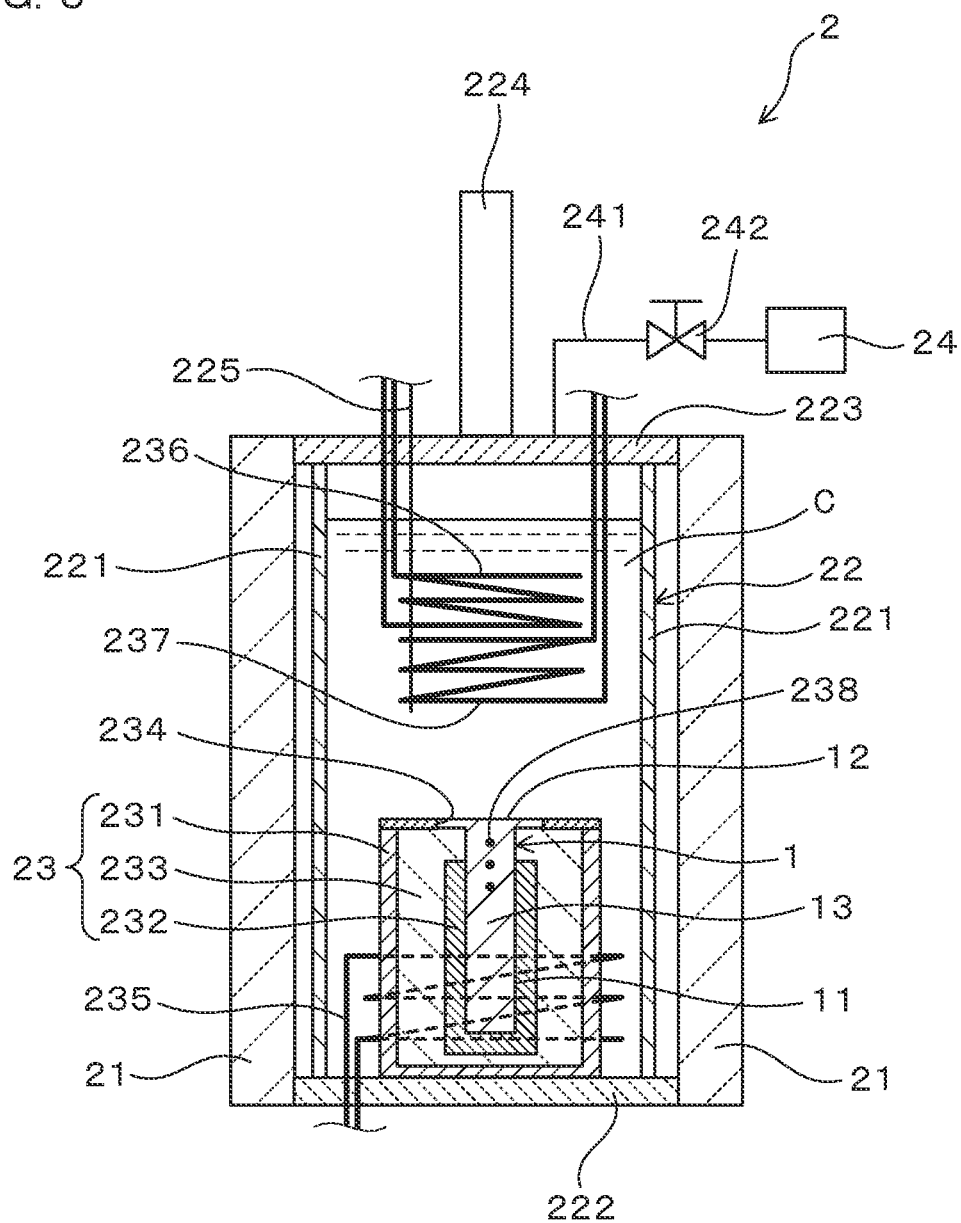
FIG. 3 is a cross-sectional view that shows the principal parts of a test apparatus for a subcooled pool boiling test used in Working Example 1.

As shown in FIG. 3, a test apparatus 2 used in the subcooled pool boiling test comprises: a heat-insulating part 21, which is composed of a heat-insulating material and exhibits a tube shape; a coolant pool 22, which is disposed in a tube of the heat-insulating part 21; a heat-source part 23, which is disposed inside the coolant pool 22 and heats the heat-transfer member 1; and a vacuum pump 24 for degassing a coolant C inside the coolant pool 22.

The coolant pool 22 comprises a sidewall part 221, which is disposed facing the heat-insulating part 21, a top-wall part 223, which closes up an upper end of the sidewall part 221, and a bottom-wall part 222, which closes up a lower end of the sidewall part 221, and is configured such that the coolant C can pool in an interior space surrounded by the sidewall part 221, the top-wall part 223, and the bottom-wall part 222.

A condenser 224 is mounted on the top-wall part 223. The condenser 224 is configured such that it can condense the vapor of the coolant C inside the coolant pool 22 and return it into the coolant pool 22 as coolant C in the liquid phase. In addition, a thermocouple 225, which is for measuring the temperature of the coolant C, is mounted on the top-wall part 223. The thermocouple 225 is disposed such that it passes through the top-wall part 223.

The heat-source part 23 is disposed on the bottom-wall part 222 of the coolant pool 22. The heat-source part 23 comprises a case 231 and a heater 232, which is disposed inside the case 231. The heater 232 is configured such that it exhibits a bottomed-tube shape and such that the rod part 13 of the heat-transfer member 1 can be inserted therein. A heat-insulating material 233 is interposed between the case 231 and the heater 232. In addition, in the state in which the rod part 13 of the heat-transfer member 1 is inserted into the heater 232, the heat-insulating material 233 is disposed such that it is interposed between the case 231 and the rod part 13.

The case 231 has an opening 234 in its top surface. The fin part 14 of the heat-transfer member 1 is disposed inside the opening 234 of the case 231.

A lower-portion coolant heater 235, which is for heating the coolant C, is disposed around the heat-source part 23. In addition, an upper-portion coolant heater 236, which is for heating the coolant C, and a coolant cooler 237, which is for cooling the coolant C, are disposed upward of the heat-source part 23. The lower-portion coolant heater 235, the upper-portion coolant heater 236, and the coolant cooler 237 are configured such that they are connected to a temperature-adjusting apparatus, which is not shown, and can adjust the temperature of the coolant C.

The vacuum pump 24 is disposed on the exterior of the coolant pool 22 and is connected to the coolant pool 22 via tubing 241, which is attached to the top-wall part 223, and a vacuum valve 242.

Next, a test method of a subcooled pool boiling test will be explained. First, after the heat-transfer member 1 has been sufficiently dried, a plurality of thermocouples 238 is mounted on the rod part 13 such that the thermocouples 238 are spaced apart in an up-down direction. The thermocouples 238 are connected to a data-processing apparatus, which is not shown. The data-processing apparatus is configured to calculate, based on the temperature(s) of the rod part 13 measured by the thermocouples 238, the temperature of the heat-dissipating surface 12 and the heat flux that flows out from the heat-dissipating surface 12 to the coolant C.

Next, a stainless ring (not shown) is mounted on the outer circumference of the fin part 14. Furthermore, the heat-transfer member 1 is disposed such that the rod part 13 of the heat-transfer member 1 is inserted into the heater 232 and the heat-dissipating surface 12 is exposed via the opening 234 of the case 231. Subsequently, the coolant C (ethanol, purity: 99.5%) is poured into the coolant pool 22 such that the height of the liquid surface from the heat-dissipating surface 12 becomes 120 mm.

Next, degassing of the coolant C is performed according to the following procedure. First, the temperature of the coolant C is adjusted, using the lower-portion coolant heater 235, the upper-portion coolant heater 236, and the coolant cooler 237, such that it becomes the saturation temperature. Subsequently, the heat-transfer member 1 is heated by the heater 232, and the coolant C on the heat-dissipating surface 12 is caused to boil. After being held in this state for 30 min, the heating by the heater 232 is stopped. Thereafter, the interior of the coolant pool 22 is depressurized using the vacuum pump 24, and thereby the coolant C is degassed. Furthermore, at the point in time when the temperature of the thermocouple, from among the plurality of the thermocouples 238 mounted on the heat-transfer member 1, that is nearest the heat-dissipating surface 12 has reached the saturation temperature of the coolant C or lower, the degassing of the coolant C is complete, and the interior of the coolant pool 22 is depressurized until it reaches atmospheric pressure.

After the measurement preparations have been performed in the manner described above, the temperature of the coolant C is readjusted, using the lower-portion coolant heater 235, the upper-portion coolant heater 236, and the coolant cooler 237, such that it becomes the saturation temperature. Then, the heat-transfer member 1 is heated, using the heater 232, such that the amount of heat introduced to the heat-receiving surface 11 increases in stages. The timing with which the amount of heat introduced from the heater 232 to the heat-receiving surface 11 is increased is after two minutes from when the temperatures of the heat-dissipating surface 12 and the coolant C have reached a steady state.

Figure 4:
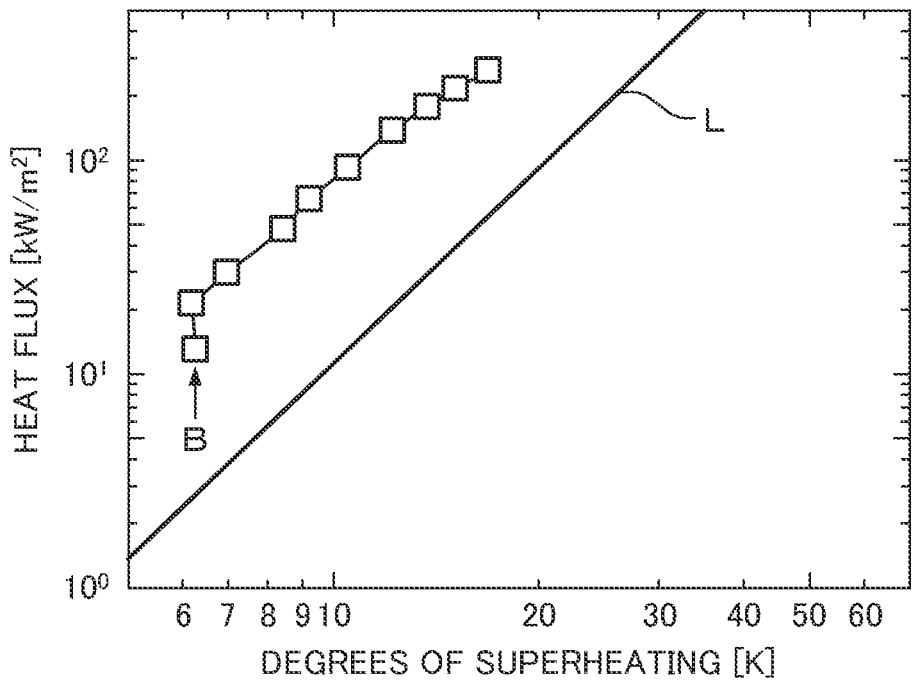
FIG. 4 is a boiling curve from the subcooled pool boiling test in which the heat-transfer member of Working Example 1 was used.

FIG. 4 shows a boiling curve of the heat-transfer member 1. It is noted that the abscissa in FIG. 4 is the degree of superheating experienced by the coolant C on the heat-dissipating surface 12, that is, the value calculated by subtracting the boiling point of the coolant C from the temperature of the heat-dissipating surface 12. Thus, as used herein, the expression "degree of superheating" is intended to mean the temperature of the heat-dissipating surface 12 minus the boiling point (saturation temperature) of the coolant C. In addition, the ordinate in FIG. 4 is the average value of the values of the heat flux that flows out from the heat-dissipating surface 12 to the coolant C during the two minutes from the point in time when the temperatures of the heat-transfer member 1 and the coolant C have reached a steady state. It is noted that the ordinate and the abscissa in FIG. 4 are both indicated on a logarithmic scale. In addition, the point at which symbol B is marked is the point at which a transition occurs from the not-yet-boiling state to the boiling state, as described below, and consequently the temperature of the heat-transfer member 1 and the coolant C before and after the start of boiling changes. Consequently, this point indicates the average value of the heat flux for 30 seconds before the start of boiling.

For the purpose of comparison with the boiling curve of the heat-transfer member 1, in FIG. 4, the heat flux of nucleate boiling, estimated based on the Rohsenow equation (Equation (1) below), is indicated by a solid line L for the situation in which the heat-dissipating surface 12 is assumed to be a smooth surface. It is noted that $C_p$ in Equation (1) below is the specific heat at constant volume [J kg$^{-1}$ K$^{-1}$], $\Delta T$ is the degree of superheating, i.e. the temperature of the heat-dissipating surface minus the saturation temperature of the coolant [K], $L_{lv}$ is the latent heat of vaporization [J kg$^{-1}$], q is the heat flux [W m$^{-2}$], $\mu$ is the dynamic viscosity [Pa s], $\sigma$ is the surface tension [N m$^{-1}$], $\rho$ is the liquid-phase coolant density [kg m$^{-3}$], $\rho_g$ is the coolant vapor density [kg m$^{-3}$], and k is the coolant thermal conductivity [W m$^{-1}$ K$^{-1}$]. In addition, $C_{sf}$ and n are parameters that are dependent on the combination of the coolant and the material of the heat-transfer member. In the present example, the value of $C_{sf}$ was set to 0.0008, and the value of n was set to 1.18. These values are values that were drawn from the literature (I. L. Pioro, "Experimental evaluation of constants for the Rohsenow pool boiling correlation", International Journal of Heat and Mass Transfer, 42, 1999, pp. 2003-2013).

Equation 1

$$\frac{C_p \Delta T}{L_{lv}} = C_{sf} \left[ \frac{q}{\mu L_{lv}} \sqrt{\frac{\sigma}{g(\rho - \rho_g)}} \right]^{0.33} \left( \frac{C_p \mu}{k} \right)^n \quad (1)$$

As shown in FIG. 4, in the situation in which the heat-transfer member 1 of the present example was used, the coolant C did not boil until the degree of superheating became approximately 6 K, and the value of the heat flux increased gradually along with the rising of the degree of superheating. Then, at the point in time when the degree of superheating became approximately 8 K, the coolant on the heat-dissipating surface 12 began to boil (refer to symbol B). After boiling started, because the temperature of the heat-dissipating surface 12 decreased owing to the heat of vaporization of the coolant C, the degree of superheating of the coolant C decreased temporarily and, simultaneously, the heat flux that flowed out from the heat-dissipating surface 12 to the coolant C owing to the evaporation of the coolant C increased. Thereafter, when the heating was continued further, the value of the heat flux increased along with the rising of the degree of superheating. In addition, the slope of the boiling curve after boiling was larger than the slope of the boiling curve before boiling.

As shown in FIG. 4, by providing the pores 121, which have an average pore diameter in the above-mentioned specific range, on the heat-dissipating surface 12 as in the heat-transfer member 1 of the present example, the heat flux could be set 5 times or more greater compared to a smooth heat-dissipating surface and the cooling performance could be more markedly improved.

Working Example 2

The present example is an example in which the surface state of the heat-dissipating surface 12 was modified. It is noted that symbols, from among the symbols used in examples subsequent to the present example, that are identical to symbols used in the preceding example indicate structural elements that are the same as the structural elements in the preceding example, unless otherwise described.

Figure 5:
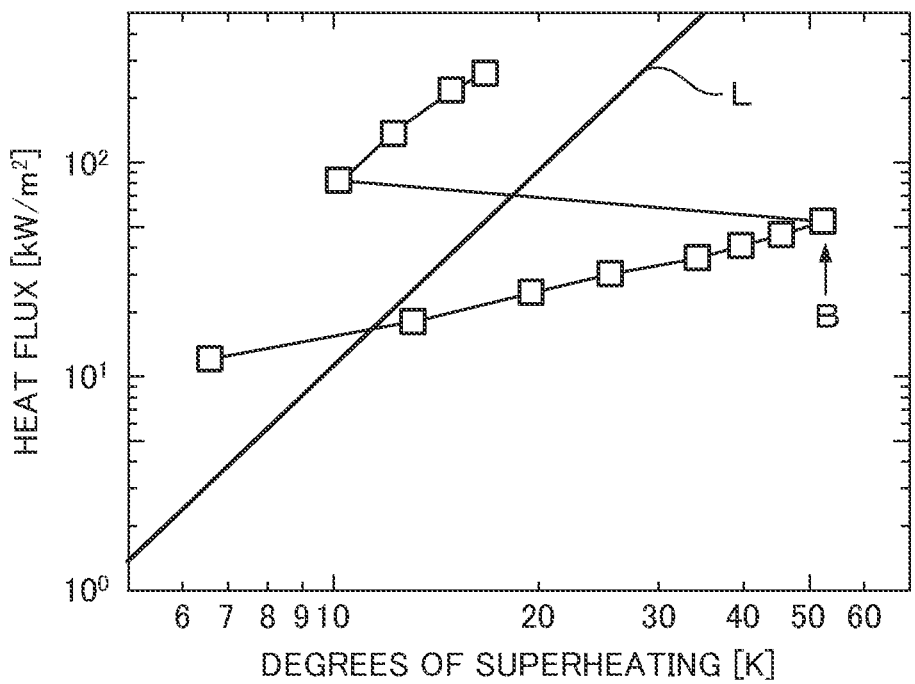
FIG. 5 is a boiling curve from the subcooled pool boiling test in which the heat-transfer member of Working Example 2 was used.

In the present example, the boiling curve is acquired by performing the subcooled pool boiling test using the same method as in Working Example 1, except that a heat-transfer member 1, in which the heat-dissipating surface 12 was wetted with ethanol in advance, was mounted on the heat-source part 23. FIG. 5 shows the boiling curve of the present example. It is noted that the abscissa in FIG. 5 is the degree of superheating of the coolant C on the heat-dissipating surface 12. In addition, the ordinate in FIG. 5 is the average value of the values of the heat flux that flowed out from the heat-dissipating surface 12 to the coolant C in the two minutes from the point in time when the temperatures of the heat-transfer member 1 and the coolant C have reached a steady state. Because the plot point indicated by symbol B is the point at which the transition occurs from the not-yet-boiling state to the boiling state as described below, this point indicates the average value of the heat flux in the 30 seconds prior to the start of boiling, the same as in FIG. 4.

As shown in FIG. 5, in the situation in which the heat-transfer member 1 of the present example is used, the coolant C did not boil until the degree of superheating of the coolant C on the heat-dissipating surface 12 became approximately 50 K, and the value of the heat flux increased slowly along with the rising of the degree of superheating. Furthermore, at the point in time when the degree of superheating became approximately 50 K, the coolant on the heat-dissipating surface 12 began to boil (refer to symbol B). After boiling started, the same as in Working Example 1, the value of the heat flux increased along with the rising of the degree of superheating. In addition, the slope of the boiling curve after boiling was larger than the slope of the boiling curve before boiling. Furthermore, the slope of the boiling curve after boiling in the present example was a value on the same order as the slope of the boiling curve after boiling in Working Example 1.

Because the heat-transfer member 1 of the present example was disposed inside the coolant pool 22 with the heat-dissipating surface 12 wetted with ethanol as is, it is conceivable that the ethanol was present also inside the pores 121 of the heat-dissipating surface 12. Consequently, compared with Working Example 1, there was a risk that the start of boiling inside the pores 121 would be greatly delayed, and thereby the degree of superheating would become excessively high when the coolant began to boil. On the other hand, once boiling had started, the same as Working Example 1, the heat flux could be made larger than in a smooth heat-dissipating surface owing to the effect of the pores 121, and consequently cooling performance could be markedly improved.

Working Example 3

The present example is an example of a heat-transfer member 103 (refer to FIG. 6), in which an alumite coating 123, which serves as a coolant-philic part 122, and coating films 125, which serve as coolant-phobic parts 124, were provided on the heat-dissipating surface 12. Although not shown in the drawings, the heat-transfer member 103 of the present example has the same shape as the heat-transfer member 1 of Working Example 1. The heat-dissipating surface 12 of the heat-transfer member 103 was provided with the end surface 132, which is on the side of the rod part 13 opposite that of the heat-receiving surface (not shown), and the fin part 14, which is disposed around the end surface 132.

The alumite coating 123, which had a plurality of the pores (not shown), was provided on the heat-dissipating surface 12. The average pore diameter of the pores on the alumite coating 123 was 200 nm, and the average depth of the pores was 10 μm. In addition, the contact angle between the alumite coating 123 and ethanol was 12°. The alumite coating 123 of the present example was formed by a phosphoric acid direct-current alumite process. The process conditions of the phosphoric acid direct-current alumite process in the present example were phosphoric acid concentration: 0.3 mol/dm$^3$, electrolyte temperature: 20° C., electric-current density: 5 mA/cm$^2$, and hold time: 60 min.

Figure 6:
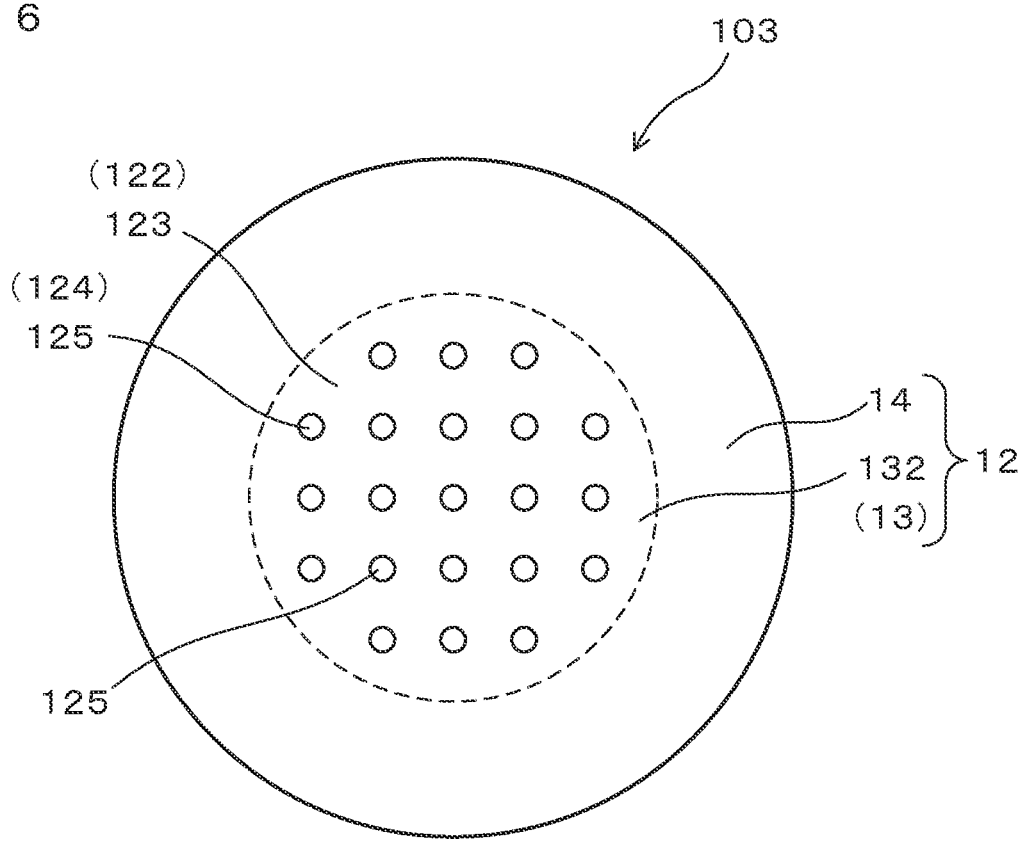
FIG. 6 is a plan view of the heat-dissipating surface of the heat-transfer member according to Working Example 3.

A plurality of the coating films 125, which were lined up equispaced in a longitudinal direction and a transverse direction as shown in FIG. 6, were provided on the alumite coating 123. The coating films 125 exhibited a circular shape having a diameter of 2 mm, and the spacing between adjacent coating films 125 was 3 mm. In addition, the contact angle between the coating films 125 and ethanol was 95°.

Figure 7:
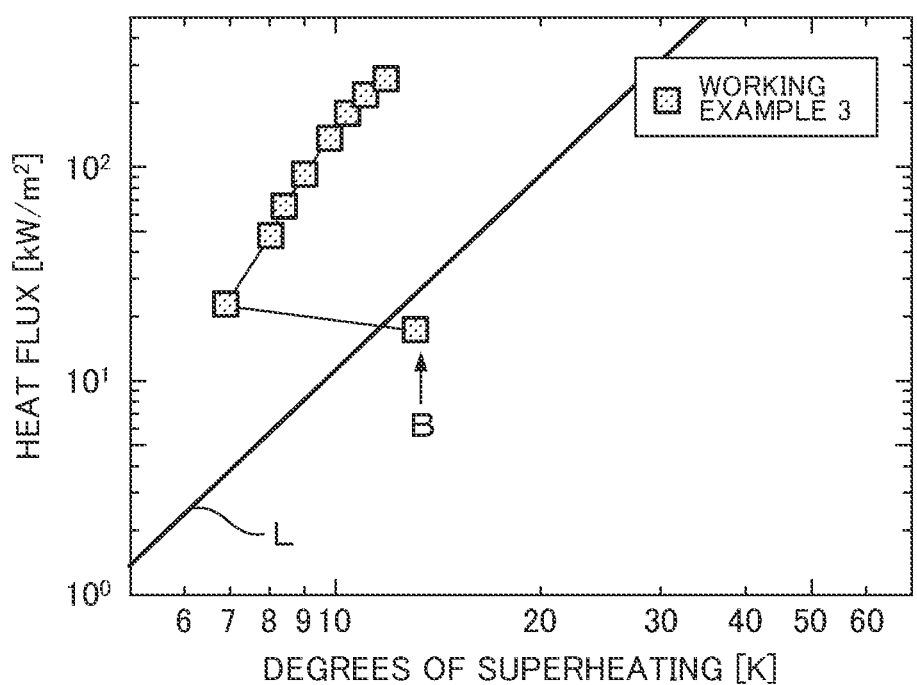
FIG. 7 is a boiling curve from a subcooled pool boiling test in which the heat-transfer member of Working Example 3 was used.

FIG. 7 shows a boiling curve that was obtained by performing a subcooled pool boiling test using the heat-transfer member 103 in which the heat-dissipating surface 12 was wetted with the coolant in advance, the same as in Working Example 2. It is noted that the test conditions of the subcooled pool boiling test in the present example were the same as in Working Example 1. In addition, the ordinate, the abscissa, and the representations of the symbol B and the straight line L in FIG. 7 were the same as those in FIG. 4.

As shown in FIG. 7, when the subcooled pool boiling test was performed using the heat-transfer member 103, the coolant on the heat-dissipating surface 12 began to boil (refer to symbol B) at the point in time when the degree of superheating became approximately 9 K. After boiling started, because the temperature of the heat-dissipating surface 12 decreased owing to the heat of vaporization of the coolant, the degree of superheating of the coolant temporarily decreased and, simultaneously, the heat flux that flowed out from the heat-dissipating surface 12 to the coolant increased owing to the evaporation of the coolant. After boiling started, the value of the heat flux increased along with the rising of the degree of superheating.

The portion of the boiling curve shown in FIG. 7 that is after boiling is located upward of the straight line L. Based on the comparison of the boiling curve after boiling and the straight line L, it could be understood that, after coolant boiling, the heat flux of the heat-transfer member 103 could be made larger than in a heat-transfer member having a smooth heat-dissipating surface in the situation in which the degree of superheating was the same, and thereby cooling performance could be improved compared to a heat-transfer member having a smooth heat-dissipating surface.

Furthermore, based on a comparison of FIG. 5 and FIG. 7, it could be understood that, with regard to the heat-transfer member 103 in which the coating films 125 were provided on the alumite coating 123 formed by the phosphoric acid direct-current alumite process, in the situation in which it was used in the state in which it was wetted with the coolant in advance, the degree of superheating at the start of boiling could be made lower than in the heat-transfer member 1 that did not have the coating films 125.

Working Example 4

The present example is an example of the heat-transfer member (not shown) in which the alumite coating, which was formed by a sulfuric acid direct-current alumite process, was provided on the heat-dissipating surface. The method of manufacturing the heat-transfer member in the present example was the same as that in Working Example 1, except that the sulfuric acid direct-current alumite process, instead of the phosphoric acid direct-current alumite process, was performed as the anodization process. It is noted that the process conditions of the sulfuric acid direct-current alumite process were sulfuric acid concentration: 1.5 mol/dm$^3$, electrolyte temperature: 20° C., electric-current density: 10 mA/cm$^2$, and hold time: 30 min.

The average pore diameter of the pores in the heat-dissipating surface of the heat-transfer member in the present example was 10 nm, and the average depth of the pores was 10 μm. It is noted that the methods of calculating the average pore diameter and the average depth of the pores were as described above. The contact angle between the alumite coating and ethanol for the heat-transfer member in the present example could not be measured because the ethanol did not form droplets on the alumite coating and therefore a so-called wetness spreading state was obtained.

Figure 8:
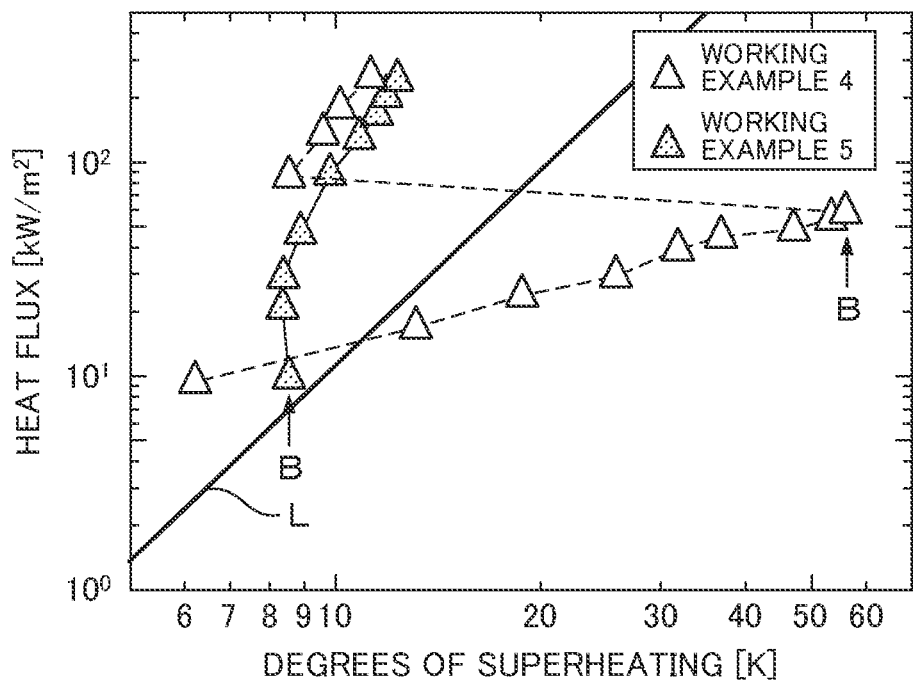
FIG. 8 is a boiling curve from the subcooled pool boiling test in which the heat-transfer members of Working Example 4 and Working Example 5 were used.

FIG. 8 shows the boiling curve obtained by performing the subcooled pool boiling test using the heat-transfer member of the present example, in which the heat-dissipating surface was wetted with the coolant in advance, the same as in Working Example 2. It is noted that the test conditions of the subcooled pool boiling test in the present example were the same as in Working Example 1. In addition, the ordinate, the abscissa, and the representations of the symbol B and the straight line L in FIG. 8 were the same as those in FIG. 4.

As shown in FIG. 8, when the subcooled pool boiling test was performed using the heat-transfer member of the present example, the coolant did not boil until the degree of superheating became approximately 56 K, and the value of the heat flux increased slowly along with the rising of the degree of superheating. Furthermore, the coolant on the heat-dissipating surface began to boil (refer to symbol B) at the point in time when the degree of superheating became approximately 56 K. After boiling started, because the temperature of the heat-dissipating surface decreased owing to the heat of vaporization of the coolant, the degree of superheating of the coolant temporarily decreased and, simultaneously, the heat flux that flowed out from the heat-dissipating surface to the coolant increased owing to the evaporation of the coolant C. After boiling started, the value of the heat flux increased along with the rising of the degree of superheating. In addition, the slope of the boiling curve after boiling was larger than the slope of the boiling curve before boiling.

In addition, the portion of the boiling curve shown in FIG. 8 that is after boiling is located upward of the straight line L. Based on a comparison of the boiling curve after boiling and the straight line L, it could be understood that, after coolant boiling, the heat flux of the heat-transfer member of the present example could be made larger than in a heat-transfer member having a smooth heat-dissipating surface in the situation in which the degree of superheating was the same, and thereby cooling performance could be improved over a heat-transfer member having a smooth heat-dissipating surface.

Working Example 5

The present example is an example of the heat-transfer member (not shown) in which coating films, which serve as coolant-phobic parts, were provided on the heat-dissipating surface of the heat-transfer member of Working Example 4. In the present example, first, a heat-transfer member, having a rod part and a fin part and in which an alumite coating serving as a coolant-philic part was provided on the heat-dissipating surface, was manufactured using the same method as in Working Example 4. A plurality of the coating films was formed, the same as in Working Example 3, on the obtained alumite coating of the heat-transfer member. Based on the above, the heat-transfer member of the present example could be obtained. The contact angle between the coating films of the heat-transfer member of the present example and ethanol was 110°.

FIG. 8 shows a boiling curve obtained by performing a subcooled pool boiling test using the heat-transfer member of the present example, in which the heat-dissipating surface was wetted with the coolant in advance, the same as in Working Example 2. It is noted that the test conditions of the subcooled-pool boiling test in the present example were the same as those in Working Example 1. In addition, the ordinate, the abscissa, and the representations of the symbol B and the straight line L in FIG. 8 were the same as in the FIG. 4.

As shown in FIG. 8, when the subcooled pool boiling test was performed using the heat-transfer member of the present example, the coolant on the heat-dissipating surface began to boil (refer to symbol B) at the point in time when the degree of superheating became approximately 8 K. After boiling started, because the temperature of the heat-dissipating surface decreased owing to the heat of vaporization of the coolant, the degree of superheating of the coolant temporarily decreased and, simultaneously, the heat flux that flowed out from the heat-dissipating surface to the coolant increased owing to the evaporation of the coolant. After boiling started, the value of the heat flux increased along with the rising of the degree of superheating.

The portion of the boiling curve shown in FIG. 8 that is after boiling is located upward of the straight line L. Based on a comparison of the boiling curve after boiling and the straight line L, it could be understood that, after coolant boiling, the heat flux of the heat-transfer member of the present example could be made larger than in a heat-transfer member having a smooth heat-dissipating surface in the situation in which the degree of superheating was the same, and thereby the cooling performance could be improved compared to a heat-transfer member having a smooth heat-dissipating surface.

Furthermore, based on a comparison of the heat-transfer member of Working Example 4 and the heat-transfer member of Working Example 5 that are shown in FIG. 8, it could be understood that, with regard to the heat-transfer member (Working Example 5), in which the coating films were provided on the alumite coating formed using the sulfuric acid direct-current alumite process, in the situation in which the heat-transfer member was used in the state in which it was wetted with the coolant in advance, the degree of superheating when boiling started could be lowered more than in the heat-transfer member (Working Example 4) that did not have coating films.

Working Example 6

The present example is an example of the heat-transfer member in which the alumite coating formed by a direct-current alumite process was provided on the heat-dissipating surface. The method of manufacturing the heat-transfer member of the present example is the same as in Working Example 1, except that a direct-current alumite process, in which an alkali electrolyte is used, instead of the phosphoric acid direct-current alumite process, was performed as the anodization process. It is noted that the process conditions of the direct-current alumite process were electrolyte: an aqueous solution having sodium pyrophosphate as its main component, electrolyte concentration: 0.1 mol/dm$^3$, electrolyte temperature: 60° C., electric-current density: 60 mA/cm$^2$, frequency: 50 Hz, and hold time: 30 s.

In addition to sodium pyrophosphate, for example, a phosphate such as sodium phosphate, sodium hydrogen phosphate, potassium pyrophosphate, sodium metaphosphate, or the like; an alkali metal hydroxide such as sodium hydroxide, potassium hydroxide, or the like; a carbonate such as sodium carbonate, sodium bicarbonate, potassium carbonate, or the like; ammonium hydroxide, or the like can be used as the electrolyte used in the direct-current alumite process. These electrolytes may be used independently, or two or more may be used in combination.

The average pore diameter of the pores on the heat-dissipating surface of the heat-transfer member of the present example was 20 nm, and the average depth of the pores was 0.2 μm. It is noted that the methods of calculating the average pore diameter and the average depth of the pores were as described above. The contact angle between the alumite coating of the heat-transfer member of the present example and ethanol was 0°.

Figure 9:
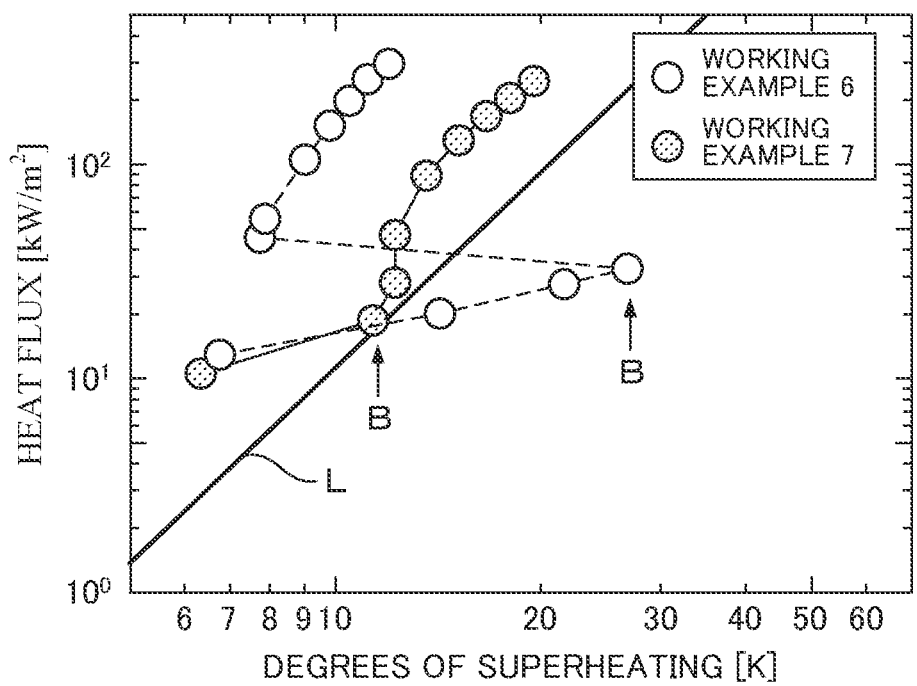
FIG. 9 is a boiling curve from a subcooled pool boiling test in which the heat-transfer members of Working Example 6 and Working Example 7 were used.

FIG. 9 shows a boiling curve that was obtained by performing a subcooled pool boiling test using the heat-transfer member of the present example in which the heat-dissipating surface was wetted with the coolant in advance, the same as in Working Example 2. It is noted that the test conditions of the subcooled pool boiling test in the present example were the same as in Working Example 1. In addition, the ordinate, the abscissa, and the representation of the straight line L in FIG. 9 were the same as in FIG. 4.

As shown in FIG. 9, when the subcooled pool boiling test was performed using the heat-transfer member of the present example, the coolant did not boil until the degree of superheating became approximately 27 K, and the value of the heat flux increased slowly along with the rising of the degree of superheating. Furthermore, the coolant on the heat-dissipating surface began to boil (refer to symbol B) at the point in time when the degree of superheating became approximately 27 K. After boiling started, because the temperature of the heat-dissipating surface decreased owing to the heat of vaporization of the coolant, the degree of superheating of the coolant temporarily decreased and, simultaneously, the heat flux that flowed out from the heat-dissipating surface to the coolant increased owing to the evaporation of the coolant. After boiling started, the value of the heat flux increased along with the rising of the degree of superheating.

The portion of the boiling curve shown in FIG. 9 that is after boiling is located upward of the straight line L. Based on the comparison of the boiling curve after boiling and the straight line L, it could be understood that, after coolant boiling, the heat flux of the heat-transfer member of the present example could be made larger than in a heat-transfer member having a smooth heat-dissipating surface in the situation in which the degree of superheating was the same, and thereby the cooling performance could be improved over a heat-transfer member having a smooth heat-dissipating surface.

Working Example 7

The present example is an example of a heat-transfer member (not shown) in which coating films are provided as coolant-phobic parts on the heat-dissipating surface of the heat-transfer member of Working Example 6. In the present example, first, a heat-transfer member having a rod part and a fin part and in which an alumite coating was provided as a coolant-philic part on the heat-dissipating surface was manufactured using the same method as in Working Example 6. The plurality of coating films was formed, the same as in Working Example 3, on the obtained alumite coating of the heat-transfer member. Based on the above, the heat-transfer member of the present example could be obtained. The contact angle between the coating films of the heat-transfer member of the present example and ethanol was 110°.

FIG. 9 shows a boiling curve that was obtained by performing a subcooled pool boiling test using the heat-transfer member of the present example, in which the heat-dissipating surface was wetted with the coolant in advance, the same as in Working Example 2. It is noted that the test conditions of the subcooled pool boiling test in the present example were the same as in Working Example 1. In addition, the ordinate, the abscissa, and the representation of the straight line L in FIG. 9 were the same as in FIG. 4.

As shown in FIG. 9, when the subcooled pool boiling test was performed using the heat-transfer member of the present example, the coolant on the heat-dissipating surface began to boil (refer to symbol B) at the point in time when the degree of superheating became approximately 8 K. After boiling started, the region in which the coolant on the heat-dissipating surface boiled enlarged gradually along with the rising of the degree of superheating. Attendant therewith, the value of the heat flux increased slowly. Furthermore, the slope of the boiling curve became large at the point in time when the degree of superheating became approximately 10 K.

The portion of the boiling curve shown in FIG. 9 that is after boiling is located upward of the straight line L. Based on a comparison of the boiling curve after boiling and the straight line L, it could be understood that, after coolant boiling, the heat flux of the heat-transfer member of the present example could be made larger than in a heat-transfer member having a smooth heat-dissipating surface in the situation in which the degree of superheating was the same, and thereby cooling performance could be improved compared to a heat-transfer member having a smooth heat-dissipating surface.

Furthermore, based on a comparison of Working Example 6 and Working Example 7 that are shown in FIG. 9, it could be understood that, with regard to the heat-transfer member (Working Example 7) in which the coating films were provided on the alumite coating formed by the direct-current alumite process, in the situation in which the heat-transfer member was used in the state in which it was wetted with the coolant in advance, the degree of superheating at the start of boiling could be made lower than in the heat-transfer member (Working Example 6) that did not have the coating films.

Specific aspects of the heat-transfer member and the cooling system according to the present invention are not limited to the aspects described in Working Examples 1-7 described above, and the configuration can be suitably modified within a range that does not deviate from the gist of the present invention.

For example, in the situation in which the coolant-phobic parts 124 are formed by the coating films, as in the present example, the coating films may be formed such that they cover the pores 121, and the coating films may penetrate into the interiors of the pores 121. In the situation in which the coating films penetrate into the interiors of the pores 121, the adhesiveness between the coating films and the heat-dissipating surface 12 is further improved, and thereby the coating films become less likely to peel. Thereby, the state, in which the coolant-phobic parts 124 have been formed, can be maintained over a longer period, and thereby excellent cooling performance can be exhibited over a longer time.

The invention claimed is:

1. A heat-transfer member configured for use in a cooling system, in which an alcohol serves as a coolant, wherein:
   the heat-transfer member has:
      a heat-receiving surface configured to receive heat from a heat-generating body; and
      a heat-dissipating surface configured to dissipate, to the coolant, the heat received at the heat-receiving surface;
   a plurality of pores are defined on the heat-dissipating surface and an average pore diameter of the pores is 5 nm or more and 1,000 nm or less;
   the pores have an average depth of 0.05 μm or more and 10 μm or less; and
   the heat-dissipating surface has a coolant-philic part that exhibits a contact angle with respect to ethanol of 40° or less.

2. The heat-transfer member according to claim 1, wherein the heat-dissipating surface has a coolant-phobic part disposed adjacent to the coolant-philic part, the coolant-phobic part exhibiting a contact angle with respect to ethanol of 90° or more.

3. The heat-transfer member according to claim 2, wherein the heat-dissipating surface has a plurality of the coolant-phobic parts.

4. The heat-transfer member according to claim 1, wherein the average pore diameter is 10-1000 nm.

5. The heat-transfer member according to claim 1, wherein the average pore diameter is 10-50 nm.

6. The heat-transfer member according to claim 1, wherein the average pore depth is 0.1-10 μm.

7. The heat-transfer member according to claim 1, wherein the heat-dissipating surface is anodized.

8. The heat-transfer member according to claim 1, wherein at least some of the pores are located within the coolant-philic part.

9. The heat-transfer member according to claim 3, wherein at least some of the pores are located within the coolant-philic part.

10. The heat-transfer member according to claim 9, wherein two or more of the coolant-phobic parts are provided per square centimeter.

11. The heat-transfer member according to claim 10, wherein the heat-dissipating surface is anodized.

12. The heat-transfer member according to claim 11, wherein:
the average pore diameter is 10-50 nm, and
the average pore depth is 0.1-10 µm.

13. The heat-transfer member according to claim 1, wherein:
the average pore diameter is 10-50 nm, and
the average pore depth is 0.1-10 µm.

14. The heat-transfer member according to claim 13, wherein at least some of the pores are located within the coolant-philic part.

15. A cooling system comprising:
the heat-transfer member according to claim 1; and
a coolant.

16. The cooling system according to claim 15, wherein the cooling system is configured such that, when the coolant begins to boil, the degree of superheating of the coolant on the heat-dissipating surface becomes 20 K or lower.

17. The cooling system according to claim 15, wherein the coolant is ethanol.

18. The cooling system according to claim 15, wherein the coolant has a boiling temperature less than 100° C.

19. The cooling system according to claim 18, wherein:
the coolant comprises ethanol,
and
the heat-dissipating surface also has a coolant-phobic part disposed adjacent to the coolant-philic part, the coolant-phobic part exhibiting a contact angle with respect to ethanol of 90° or more.

20. The cooling system according to claim 19, wherein:
the heat-dissipating surface has a plurality of the coolant-phobic parts,
the average pore diameter is 10-700 nm,
the heat-dissipating surface is anodized, and
at least some of the pores are located within the coolant-philic part.

* * * * *